United States Patent [19]

Wang et al.

[11] Patent Number: 4,750,839
[45] Date of Patent: Jun. 14, 1988

[54] SEMICONDUCTOR MEMORY WITH STATIC COLUMN DECODE AND PAGE MODE ADDRESSING CAPABILITY

[75] Inventors: Chu-Ping Wang, Carrollton; Ashwin H. Shah; Richard H. Womack, both of Dallas, all of Tex.

[73] Assignee: Texas Instruments Incorporated, Dallas, Tex.

[21] Appl. No.: 763,483

[22] Filed: Aug. 7, 1985

[51] Int. Cl.[4] .............................................. G11C 8/00
[52] U.S. Cl. .................................... 365/233; 365/241; 365/230
[58] Field of Search ............... 365/189, 230, 233, 241, 365/239, 194

[56] References Cited

U.S. PATENT DOCUMENTS 4,079,462  3/1978  Koo .................................... 365/189
4,303,993  12/1981  Panepinto, Jr. et al. ............ 365/230

FOREIGN PATENT DOCUMENTS 0098174  6/1982  Japan .................................... 365/230

OTHER PUBLICATIONS

Davis et al, "Memory Decode Architecture", IBM Tech. Disc. Bull., vol. 27, No. 4A, Sep. 1984, pp. 2290-2291.

Primary Examiner—Stuart N. Hecker
Assistant Examiner—Glenn A. Gossage
Attorney, Agent, or Firm—William E. Hiller; N. Rhys Merrett; Melvin Sharp

[57] ABSTRACT

A semiconductor memory includes a memory array (10) that is operable to be addressed in either the page mode or the static column decode mode. A column address transparent latch (20) is provided which is controlled to either directly input a column address to a column decoder (26) or to latch the address in response to the generation of the column address strobe. A sequence detect circuit (30) detects the sequence to the row address strobe and the column address strobe to determine whether the page mode or the static column decode mode is generated. The sequence detect circuit (30) generates a Y-enable signal in a circuit (31) for control of the latch (20).

8 Claims, 2 Drawing Sheets

SEMICONDUCTOR MEMORY WITH STATIC COLUMN DECODE AND PAGE MODE ADDRESSING CAPABILITY

TECHNICAL FIELD OF THE INVENTION

The present invention pertains in general to semiconductor memories and, more particularly, to the addressing modes of the semiconductor memory.

BACKGROUND OF THE INVENTION

Advances in semiconductor technology have yielded denser and faster circuits. Operation speed or response time determines the minimum time in which information can be either accessed from the storage locations or information written thereto. There are a number of factors that determine the speed with which information can be accessed in a memory array. These are such things as intermediate latches for column and row addresses, generation of timing signals, buffer delays, etc. Some of these factors are a function of design such as, for example, the sequence of timing signals utilized to access the memory array which require a predetermined number of logical steps before access is allowed. Other factors that affect response time are such things as circuit parasitics.

In accessing a memory array, a column address and a row address are input to the device and normally strobed into column and row latches by a column address strobe ($\overline{CAS}$) and a row address strobe ($\overline{RAS}$), respectively, $\overline{RAS}$ and $\overline{CAS}$ in a typical memory would allow access to one location in the memory. An additional location would require this cycle to be repeated with its inherent delays. There are a number of modes that have heretofore been utilized to increase access time for a particular application. One technique is "paging" and the other technique is "static column decode". In the page mode, a row address is strobed into the row address latch to select a row in the memory array. Thereafter, it is only necessary to generate $\overline{CAS}$ followed by an address to access a particular column. Sequential $\overline{CAS}$ signals followed by a different address will allow each column in a particular row to be accessed without requiring the generation of $\overline{RAS}$ for each memory location accessed in a given row. This eliminates the required delay between the generation of $\overline{RAS}$ and $\overline{CAS}$, thus increasing access speed.

In the static column decode mode, no column address latch is provided. Rather, only a row address latch is provided for latching the row address with the column address being fed directly to the column decoder. After the selection of a given row by latching the row address into the row address latch, it is only necessary to then asynchronously input column addresses. As soon as the column address is input, the column decoder decodes it and activates one of the column lines. Therefore, only the inherent delays of the column decoders and the inherent access time for each of the memory cells determines the delay between generation of the column address and output of valid data. There is no delay incurred as a result of the column address latch or the timing signals required to effectively latch data therein.

The use of page mode requires both a $\overline{RAS}$ input and a $\overline{CAS}$ input and an internal latch whereas the static column decode mode requires only a $\overline{RAS}$ input. The two are therefore not compatible in present circuits. Therefore, a need exists for a memory having an integrated page mode and static column decode mode on the same device without increasing the number of pins over that required for the page mode device.

SUMMARY OF THE INVENTION

The present invention disclosed and claimed herein comprises a semiconductor memory operable in either the page mode or the static column decode mode. The memory includes an array of elements arranged in rows and columns, access to a memory element provided by a selection of one of the rows or columns. The row is accessed by receiving and latching the row address in a row address latch in response to receiving RAS and decoding the latched address for activation of one of the word lines in the array. A column is accessed in either the page mode or the static column decode mode through the use of a transparent column address latch. The transparent latch is operable in the page mode to latch a column address for decoding by a column decoder in response to receiving the column address strobe. In the static column decode mode, the transparent latch is made transparent to continually apply the column address to the column decoder such that access is maintained only during the presence of the column address. A sequence detector is provided for detecting the sequence of $\overline{RAS}$ and $\overline{CAS}$ to control the transparent latch. When $\overline{RAS}$ precedes $\overline{CAS}$, the page mode is selected, and when $\overline{CAS}$ precedes $\overline{RAS}$, the static column decode mode is selected.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
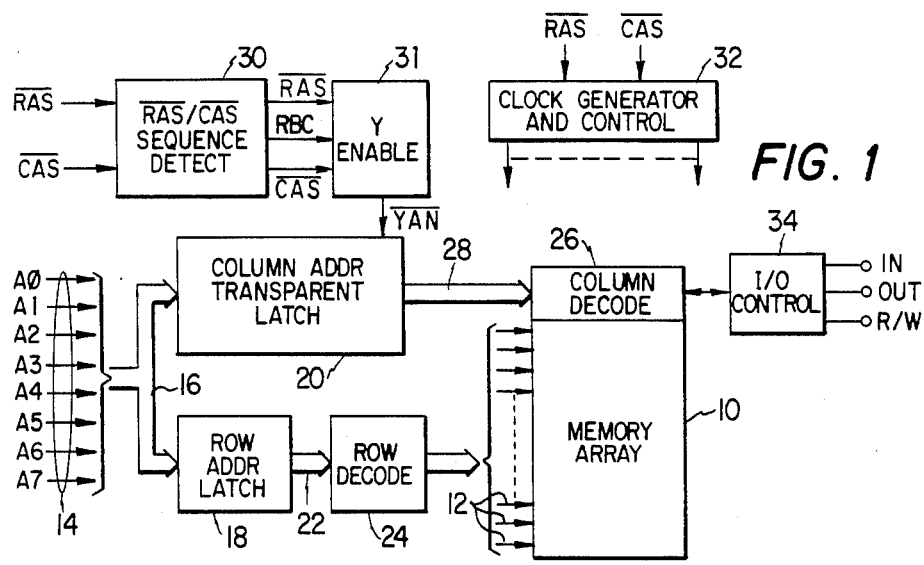
FIG. 1 illustrates a schematic block diagram of the memory of the present invention for operating in either the page mode or the static column decode mode.

Referring now to FIG. 1, there is illustrated a schematic block diagram of a semiconductor memory operable to access a memory array 10 in both the page mode and the SCD mode. The memory array 10 is a conventional array of memory elements arranged in rows and columns. This can either be a Read Only Memory (ROM) or a Random Access Memory (RAM). One example of a RAM array is illustrated in U.S. Pat. Nos. 3,940,747, issued Feb. 24, 1976 to Kitagawa and 4,081,701, issued to White et al. on Mar. 20, 1978, both assigned to Texas Instruments Incorporated. Memory elements in the array 10 are accessed by activating one of a plurality of word lines 12 for selecting the row and one of a plurality of Y-decode lines (not shown) for selecting the desired column or columns.

An address is input on address lines 14 to an address bus 16. The address bus 16 is input to a row address latch 18 and also into a column address transparent latch 20. The address on the lines 14 is multiplexed to first input the row address into the row address latch 18 and then the column address into the column address latch 20. The row address latch 18 is then output on a bus 22 to a row decode circuit 24, the output of which comprises the word lines 12. In a similar manner, the column address latch 20 latches the column address on the input of a column decoder 26 through a latched address bus 28. As will be described hereinbelow, the column address latch 20 has two modes of operation. In the first mode, it operates as a latch for latching the data in response to receiving a column address strobe and, in the second mode, connects the address bus 16 and the latched address bus 28 together to become "transparent". The first mode allows paging and the second mode allows operation in the static column decode mode "SCD". The column address latch 20 is controlled by a $\overline{RASAS}$/ sequence detect circuit 30 which receives the $\overline{RAS}$ and $\overline{CAS}$ signals and determines whether $\overline{RAS}$ precedes $\overline{CAS}$ or $\overline{CAS}$ precedes $\overline{RAS}$. The detector 30 outputs a signal RBC which is high when $\overline{RAS}$ occurs first and low when $\overline{CAS}$ occurs first. RBC is input to a Y-enable circuit 31 which controls the operation of the column address latch 20 in determining the operating mode thereof.

The memory is controlled by various timing signals which are generated by a clock generator and control circuit 32 that receives the $\overline{RAS}$ and the $\overline{CAS}$ signals and generates various timing signals. These timing signals can be either delayed representations of $\overline{CAS}$ or $\overline{RAS}$ or can be logic functions of the various timing signals generated that generally control access to the array 10. An input/output control circuit (I/O) 34 is provided for interfacing with input data and output data and is controlled by the READ/WRITE signal (R/W) to control whether data is input to the memory array 10 or is output therefrom, the memory array 10 being a RAM.

In operation, the sequence detect circuit 30 is designed to generate RBC as a function of the sequence of $\overline{RAS}$ and $\overline{CAS}$. If $\overline{RAS}$ precedes $\overline{CAS}$, the circuit operates in the page mode and RBC is high. The Y-enable signal is generated in response to receiving successive $\overline{CAS}$ signals to latch in new addresses. However, if $\overline{CAS}$ precedes $\overline{RAS}$, the circuit operates in the SCD mode and the column address latch 20 is placed in a transparent configuration to allow successive column addresses to be asynchronously input to the column decoder 26.

Figure 2:
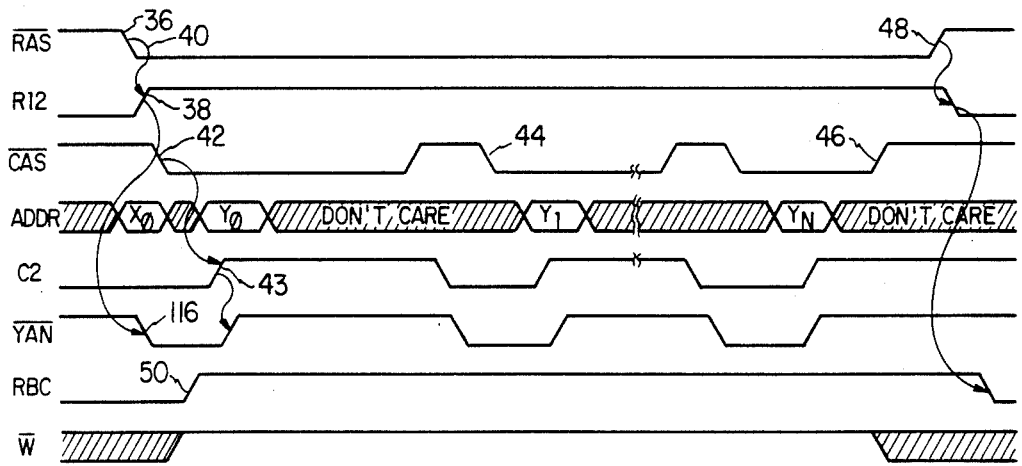
FIG. 2 illustrates a timing diagram for the page mode of the operation.

Referring now to FIG. 2, there is illustrated a timing diagram for operation in the page mode. In the page mode, $\overline{RAS}$ is first generated by changing the $\overline{RAS}$ signal from a logic high to a logic low, as represented by a transition 36. This transition 36 causes generation of a transition 38 from a low to a high state, as indicated by a cause and effect arrow 40, the transition 38 comprising a signal R12. The signal R12 is a delayed inverted $\overline{RAS}$ signal and is operable to control the row address latch 18 to latch an address therein. The address latched in the row address latch 18 is represented by an address $X_0$. In addition, R12 at transition 38 causes the Y-enable signal ($\overline{YAN}$) to go from a high to a low to connect the column address to the column decoder 26.

After generation of the $\overline{RAS}$ signal, the $\overline{CAS}$ signal is generated by changing the logic state of $\overline{CAS}$ from high to low, as represented by a transition 42. The transition 42 causes generation of a transition 43 on a signal C2 which is a delayed and inverted $\overline{CAS}$ signal. The C2 signal causes $\overline{YAN}$ to go high and latch the address in the latch 20. Thereafter, $\overline{CAS}$ is raised high and then low, as indicated by a transition 44 and $\overline{YAN}$ is again pulled low or toggled by $\overline{CAS}$ to latch a column address $Y_1$ in the column address latch 20. Thereafter, subsequent column addresses $Y_2$-$Y_n$ are latched into the column address latch 20 to address the remaining column positions in row $X_0$. At the end of the page, $\overline{CAS}$ is again raised high, as indicated by a transition 46, and then $\overline{RAS}$ is raised high, as indicated by a transition 48.

When $\overline{RAS}$ precedes $\overline{CAS}$, RBC denoting $\overline{RAS}$ before $\overline{CAS}$ is raised from a low to a high, as indicated by a transition 50. As will be described hereinbelow, this signal in part determines the operation of the $\overline{YAN}$ signal. A Write signal ($\overline{W}$) is also generated with the state thereof determining whether the memory is in the Read mode or the Write mode. In the Read mode, $\overline{W}$ is raised high and, in the Write mode, $\overline{W}$ is pulled low. Although not shown, conventional timing requires that the data be written into the access memory locations after a predetermined amount of delay to allow settling of the decoders and associated accessing circuitry.

Figure 3:
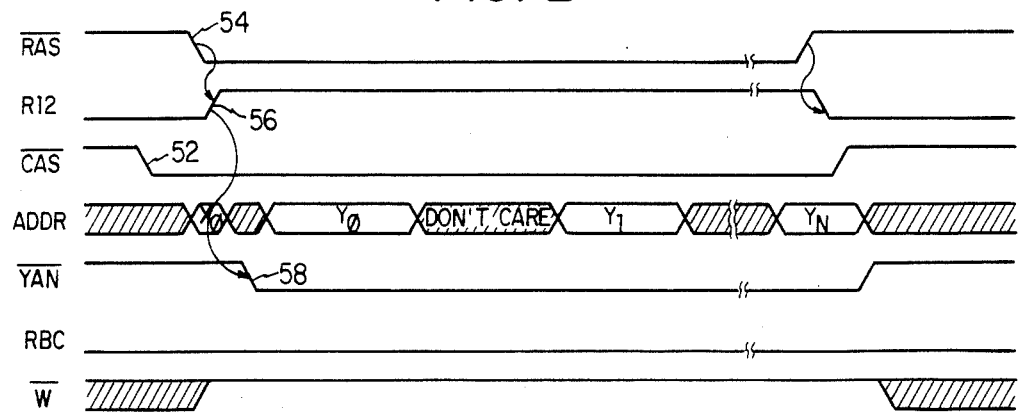
FIG. 3 illustrates a timing diagram for the static column decode mode of operation.

Referring now to FIG. 3, there is illustrated a timing diagram for the SCD mode. In this mode, $\overline{CAS}$ is first pulled low, as indicated by a transition 52. Thereafter, $\overline{RAS}$ is pulled low, as indicated by a transition 54 which also causes R12 to be pulled high, as indicated by a transition 56. The transition 56 causes the address $X_0$ on the address bus 16 to be latched into the row address latch 18 for selection of one of the word lines 12. After a predetermined amount of delay, $\overline{YAN}$ is pulled low by R12 and transition 56, as represented by a transition 58 and remains low. During this time, addresses $Y_0$-$Y_n$ are then asynchronously input on the address bus 16. The column address latch 20 in this mode is transparent such that the column decoder 26 is directly connected through the bus 28 to the address bus 16. Therefore, the access delay is a function only of the internal delays of the transparent latch 20, the column decoder 26 and the memory array 10. There are no timing delays resulting from the requirement to generate $\overline{CAS}$, wait a predetermined amount of time and then place the address on the bus, as was necessary in the page mode of FIG. 2. In the SCD mode, RBC is maintained low since $\overline{CAS}$ preceded $\overline{RAS}$. Therefore, both the page mode and the SCD mode are resident in a single device with mode selection determined by the sequence in which $\overline{RAS}$ and $\overline{CAS}$ are generated.

Figure 4:
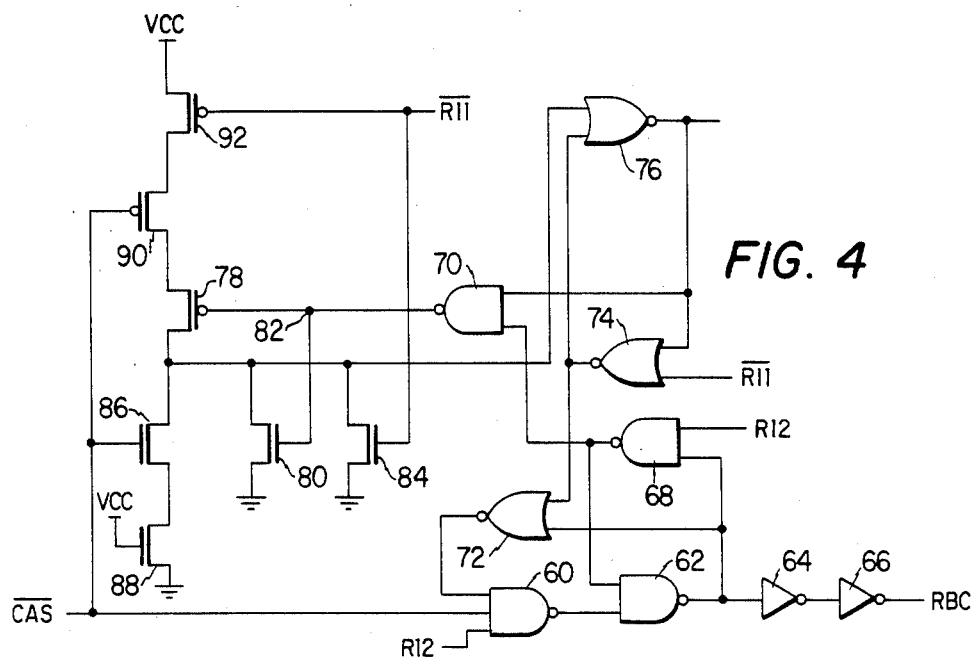
FIG. 4 illustrates a schematic block diagram of the RAS/CAS sequential detection circuit.

Referring now to FIG. 4, there is illustrated an expanded block diagram of the sequence detect circuit 30 of FIG. 1. $\overline{CAS}$ and R12 are input to two inputs of a three input NAND gate 60, the output of which is connected to one input of a two input NAND gate 62. The output of NAND gate 62 is input through two series connected inverters 64 and 66 to output RBC. The output of NAND gate 62 is also input to one input of a two input NAND gate 68, the other input of which is connected to R12. The output of NAND gate 68 is connected to the other input of NAND gate 62 and also one input of NAND gate 70. The output of NAND gate 62 is also input to one input of a NOR gate 72, the output of which is connected to the third input of NAND gate 60.

A NOR gate 74 has one input thereof connected to a signal $\overline{R11}$ and the output connected to both the other input of the NOR gate 72 and one input of a NOR gate 76. The signal $\overline{R11}$ is a delayed version of $\overline{RAS}$ and inverted with respect to R12. The output of NOR gate 76 is connected to the other input of NOR gate 74.

The output of NAND gate 70 is connected to the gates of a p-channel transistor 78 and an n-channel transistor 80. The n-channel transistor 80 has the source thereof connected to ground and the drain thereof connected to a node 82 which is connected to the other input of the OR gate 76. An n-channel transistor 84 is connected between node 82 and ground with the gate thereof connected to $\overline{R11}$. Node 82 is connected to ground through two series n-channel transistors 86 and 88, the gate of transistor 88 being connected to $V_{CC}$ and the gate of transistor 86 being connected to $\overline{CAS}$. Transistor 78 has the drain thereof connected to node 82 and the source thereof connected to the drain of a p-channel transistor 90. Transistor 90 has the gate thereof connected to $\overline{CAS}$ and the source thereof connected to the drain of the p-channel transistor 92. Transistor 92 has the gate thereof connected to $\overline{R11}$ and the source thereof connected to $V_{CC}$.

In operation, the circuit of FIG. 4 functions in one mode when $\overline{RAS}$ occurs before $\overline{CAS}$ and in another mode when $\overline{CAS}$ occurs before $\overline{RAS}$. In the first mode, which is the page mode, RBC goes from a low to a high. In the second mode, RBC is maintained low as a result of $\overline{CAS}$ occurring before RAS. Initially, before either $\overline{RAS}$ or $\overline{CAS}$ changes, RBC is low as a result of the output of NAND gate 62 being low. This is a result of a high on both inputs thereof. Therefore, the output of NAND gate 60 is high. The output of NAND gate 60 is maintained high since R12, the inverse of $\overline{RAS}$, is low. Until R12 changes, the output of NAND gate 60 will be maintained high. The NAND gate 68 has a low on both inputs thereof since R12 is low before $\overline{RAS}$ changes. This maintains a high on the other input on the NAND gate 62. In addition, it places a high on one input of NAND gate 70. The NOR gate 74 has a high on the $\overline{R11}$ input, thus resulting in a low on the output thereof. This low is input to both NOR gate 72 and NOR gate 76. NOR gate 72 also has a low received from the output of the NAND gate 62 resulting in a high on the output thereof for input to NAND gate 60. $\overline{CAS}$ is high, resulting in transistor 86 being turned on and pulling node 82 to ground, thus placing a low on the other input of NOR gate 76. This results in a high on the output thereof and a subsequent high on the other input of NOR gate 74.

In order to change the output state of NAND gate 62, all three inputs of NAND gate 60 must be raised high. When R12 goes high before $\overline{CAS}$ goes low, this results in three high inputs to NAND gate 60, resulting in the output thereof going low. The low on the output of NAND gate 60 results in a high on the output of NAND gate 62, resulting in RBC going high. The high on the output of NAND gate 62 is input to NAND gate 68 in addition to the other input going high as a result of R12 going high. The output of NAND gate 68 goes low as a result of the low input from the output of NAND gate 62, thus latching the high on the output thereof. The low output from NAND gate 68 is also input to NAND gate 70, thus changing the output thereof from a low to a high and turning on transistor 80 to maintain node 82 low. In addition, $\overline{R11}$ goes low, placing a low on one input of NOR gate 74. However, the output of NOR gate 74 does not change. Therefore, R12 causes RBC to go high. The NOR gate 72 also changes state from a high to a low as a result of the output of NAND gate 62 going high. This changes the output of the NAND gate back to a high, thus latching the high on the output of NAND gate 62.

When $\overline{CAS}$ goes low, transistor 86 is turned off and transistor 90 turned on. Since $\overline{R11}$ is also low, transistor 92 is on and transistor 84 off. However, NAND gate 70 keeps transistor 80 on and node 82 low. When R12 returns low, the output of NAND gate 68 returns to high, resulting in a high on both inputs of NAND gate 62 and a low on the output thereof. This effectively resets RBC low.

When $\overline{CAS}$ changes before $\overline{RAS}$, NAND gate 60 has the output thereof maintained high, thus preventing NAND gate 62 from changing states on the output thereof. This maintains RBC low. In addition, node 82 goes high, thus changing the output state of NOR gate 76 to a low. When RAS is generated, $\overline{R11}$ goes low, resulting in two lows on the input of NOR gate 74 and a high on the output thereof. This high is input to NOR gate 72, resulting in a low on the output thereof. This maintains NAND gate 60 in an inhibited state until $\overline{RAS}$ changes to a high again. Therefore, generation of $\overline{CAS}$ followed by $\overline{RAS}$ latches RBC low until $\overline{RAS}$ goes high again.

Figure 5:
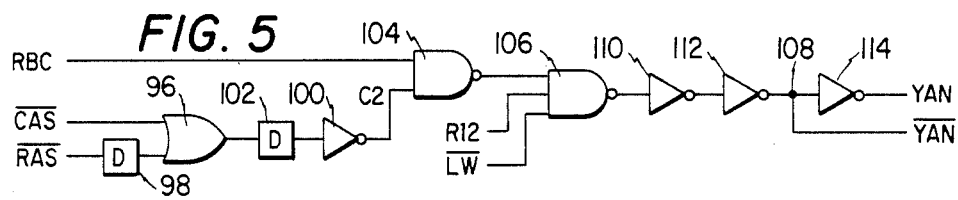
FIG. 5 illustrates a logic diagram of the Y-enable circuit.

Referring now to FIG. 5, there is illustrated a schematic diagram of the Y-enable circuit 31 of FIG. 1. $\overline{CAS}$ is input to one input of an OR gate 96, the other input of which is connected to $\overline{RAS}$ through a delay 98 to form a delay. This is similar to $\overline{R11}$. The output of OR gate 96 is input to an inverter 100 through a delay 102. The output of inverter 100 is input to one input of a NAND gate 104. The other input of the NAND gate 104 is connected to RBC. The output of NAND gate 104 is input to one input of a three input NAND gate 106, the other inputs of which are connected to a late write signal ($\overline{LW}$) and to R12. The output of NAND gate 106 is connected to a node 108 through two series inverters 110 and 112. Node 108 comprises the inverted Y-enable signal $\overline{YAN}$. Node 108 is also connected to the input of an inverter 114, the output of which comprises the Y-enable signal YAN.

In operation, the initial state of NAnd gate 104 on the output thereof is high since RBC is initially low and the output of inverter 100 is initially low. The resultant circuit of OR gate 96, delay 102 and inverter 100 is an inverted and delayed $\overline{CAS}$ when $\overline{RAS}$ is low, which is referred to as signal "C2". $\overline{LW}$ is normally high except during the Write cycle. R12 is initially low, thus maintaining the output of NAND gate 106 high, thus maintaining $\overline{YAN}$ high and YAN low. When $\overline{RAS}$ goes low, R12 goes high after a predetermined delay. This toggles NAND gate 106 low and $\overline{YAN}$ low. This is represented by a transition 116 in FIG. 2. $\overline{YAN}$ is maintained low until either $\overline{LW}$ goes low or NAND gate 104 goes low. NAND gate 104 goes low when both RBC goes high and C2 goes high. This occurs in the page mode only. Therefore, in the SCD mode, $\overline{YAN}$ is maintained low since RBC is always low, as represented by the transition 58 in FIG. 3. $\overline{YAN}$ will remain low until $\overline{RAS}$ goes high and R12 goes low.

Figure 6:
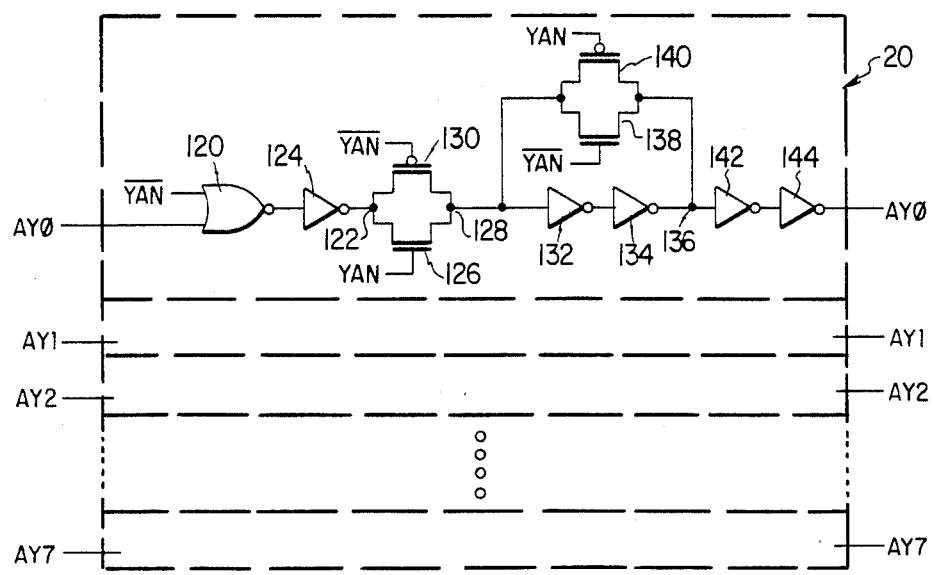
FIG. 6 illustrates a logic diagram for the transparent column latch.

Referring now to FIG. 6, there is illustrated a schematic diagram of the column address transparent latch 20 for the addresses AY0–AY7 where only the portion of the latching circuit associated with bit AY0 is illustrated. Bit AY0 is input to a NOR gate 120, the other input of which is connected to $\overline{YAN}$. The output of NOR gate 120 is connected to a node 122 through an inverter 124. An n-channel pass transistor 126 is connected between the node 122 and a node 128 with the gate thereof connected to YAN. A p-channel pass transistor 130 is connected between the nodes 122 and 128 with the gate thereof connected to $\overline{YAN}$. Two series connected inverters 132 and 134 are connected between the node 128 and a node 136. An n-channel pass transistor 138 is connected between the node 128 and 136 with the gate thereof connected to $\overline{YAN}$ and a p-channel transistor 140 is connected in parallel with transistor 138 between nodes 128 and 136 with the gate thereof connected to YAN. Node 136 is connected to the output of the column address latch 20 for the bit AY0 through two series connected inverters 142 and 144.

In operation, $\overline{YAN}$ is initially high, thus turning off pass transistors 126 and 130 and turning on transistors 138 and 140. This results in the state on the input of inverter 132 being latched on node 136 and that state being latched to the output AY0 from address latch 20. When $\overline{YAN}$ goes low, transistors 126 and 130 are turned on and transistors 138 and 140 turned off and the logic state of AY0 placed on the node 128. In this mode, the latch is "transparent". When $\overline{YAN}$ returns high in the page mode, the logic state of bit AY0 is latched with the inverters 132 and 134 and the pass transistors 138 and 140.

In summary, there has been provided a semiconductor memory that is capable of operating in either the page mode or the static column decode mode. This mode is selected by the sequence in which $\overline{RAS}$ and $\overline{CAS}$ are generated. A circuit is provided for detecting the sequence of $\overline{RAS}$ and $\overline{CAS}$ and this circuit operates a transparent column address latch. The transparent column address latch is operable to continually connect the column address to the column address decoder or to latch the information therein in response to toggling of CAS for operation in the page mode.

Although the preferred embodiment has been described in detail, it should be understood that various changes, substitutions and alterations can be made therein without departing from the spirit and scope of the invention as defined by the appended claims.

What is claimed is:

1. A semiconductor memory accessible either in the page mode or the static column decode mode, comprising:

an array of memory elements arranged in rows and columns;

row access means for receiving an external row address and accessing a row of said memory elements defined by said row address in response to receiving a row address strobe signal, said row access means maintaining access to said row after said row address is removed;

column access means for receiving an external column address and accessing a column of said memory elements defined by said column address and operable to function in either a first page mode or in a second static column decode mode;

said column access means operable in said first mode to access said column of memory elements in response to receiving said external column address and a column address strobe signal, said column access means maintaining access in said first mode after said column address is removed;

said column access means operable in said second mode to access said column of memory elements in response to receiving said external column address, said column access means maintaining access only in the presence of said column address;

mode means for receiving external signals and selecting the one of said first or second mode in which said column access means functions;

said external signals as received by said mode means comprising said row and column address strobe signals; and said mode means comprising means for detecting the sequence of said row and column address strobe signals, a first sequence selecting said first mode and a second reverse sequence selecting said second mode.

2. A semiconductor memory accessible in either the page mode or the static column decode mode, comprising:

an array of memory elements arranged in rows and columns, each of the said memory elements accessed by selecting the one of said rows and columns associated therewith;

a row decoder for decoding an externally generated row address to select one of said rows;

a row address latch for receiving and storing said row address for output to said row decoder, said row address latch storing said row address for output therefrom in response to receiving a row address strobe signal;

column access means for receiving an externally generated column address and a column address strobe signal and accessing a select one of said columns being defined by said column address, said column access means operable to access the select one of said columns in said array in either a page mode or a static column decode mode;

said column access means being in said page mode for receiving and storing said column address and maintaining access to said select column after said externally generated column address is removed such that said column address is only required to be present for a predetermined amount of time;

said column access means being in said static column decode mode for receiving and accessing said select column in said array, access maintained only during the presence of said column address, a change in said column address resulting in access of a different column being defined thereby;

mode means responsive to external signals to select said page mode or said static column decode mode in said column access means;

said external signals to which said mode means is responsive comprising said column address strobe signal and said row address strobe signal; and said mode means comprising means for detecting the sequence of generation of said column address strobe signal and said row address strobe signal, a first predetermined sequence therefore selecting said page mode and a second and opposite sequence therefor selecting said static column decode mode.

3. A method for operating a semiconductor memory in either a page mode or a static column decode mode, comprising:

disposing memory elements in an array of rows and columns, selection of one of the memory elements requiring selection of the associated row and column;

latching an externally generated row address into a latch for output therefrom in response to receiving the address and a row address strobe signal;

decoding the latched row address and selecting the row defined by the row address;

disposing a transparent latch and a decoder between a column address input and the array for receiving an externally generated column address and a column address strobe signal and selecting one of the columns in the array;

controlling the transparent latch to operate in either a page mode or a static column decode mode by detecting the sequence of generation of the row address strobe signal and the column address strobe signal, the page mode selected when the row address strobe signal precedes the column address strobe signal and the static column decode mode selected when the column address strobe signal precedes the row address strobe signal;

operation in the page mode effected by controlling the transparent latch to store the column address for decoding thereof in response to receiving a column address strobe signal, access maintained after the column address is removed such that continual reception of the column address is not required; and operation in the static column decode mode effected by controlling the transparent latch to become transparent to said column address such that continual reception of the column address is required to maintain access to the select column in the array.

4. A semiconductor memory accessible in either the page mode or the static column decode mode, comprising:

an array of memory elements arranged in rows and columns, each of the said memory elements accessed by selecting the one of said rows and columns associated therewith;

a row decoder for decoding an externally generated row address to select one of said rows;

a row address latch for receiving and storing said row address for output to said row decoder, said row address latch storing said row address for output therefrom in response to receiving a row address strobe signal;

column access means for receiving an externally generated column address and a column address strobe signal and accessing a select one of said columns being defined by said column address, said column access means operable to access the select one of said columns in said array in either a page mode or a static column decode mode;

said column access means being in said page mode for receiving and storing said column address and maintaining access to said select column after said externally generated column address is removed such that said column address is only required to be present for a predetermined amount of time, said column access means in said page mode latching said column address for output therefrom in response to receiving said external column address strobe signal;

said column access means being in said static column decode mode for receiving and accessing said select column in said array, access maintained only during the presence of said column address, a change in said column address resulting in access of a different column being defined thereby, said column access means comprising a column decoder for receiving and decoding said column address and selecting one of said columns in said array as defined by said column address, and a transparent latch for operating in said page mode to latch said column address for output therefrom in response to generation of said column address strobe signal and operable in said static column decode mode to be transparent to said column address such that said column address is continually applied to the input of said column decoder; and mode means responsive to external signals to select said page mode or said static column decode mode in said column access means;

said external signals to which said mode means is responsive comprising said column address strobe signal and said row address strobe signal; and said mode means comprising a row address strobe signal/column address strobe signal sequence detector for detecting the generation sequence of said row address strobe signal and said column address strobe signal and generating a sequence detect signal, said sequence detect signal being in a first state corresponding to said page mode when said row address strobe signal precedes said column address strobe signal, said sequence detect signal being in a second state corresponding to said static column decode mode when said column address strobe signal precedes said row address strobe signal, and enable means responsive to said sequence detect signal and said column address strobe signal to control said transparent latch to operate in said page mode when said sequence detect signal is in the first state to latch said column address in response to receiving said column address strobe signal and to operate in said static column decode mode as a transparent circuit to said column address when said sequence detect signal is in the second state.

5. The semiconductor memory of claim 4 wherein said static column decode mode can be locked into the memory by locking said column address strobe signal into an active state such that said column latch is transparent.

6. A semiconductor memory accessible either in the page mode or the static column decode mode, comprising:

an array of memory elements arranged in rows and columns;

row access means for receiving an external row address and accessing a row of said memory elements defined by said row address in response to receiving a row address strobe signal, said row access means maintaining access to said row after said row address is removed;

column access means for receiving an external column address and accessing a column of said memory elements defined by said column address and operable to function in either a first page mode or in a second static column decode mode;

said column access means comprising a transparent column address latch for receiving said external column address and operating in said first mode to latch and store said received column address for output therefrom in response to receiving a column address strobe signal, said column access means maintaining access in said first mode after said column address is removed;

said transparent column address latch operating in said second mode to be transparent to said column address to access said column of memory elements in response to receiving said external column address and maintaining access only in the presence of said column address;

column decode means for receiving said column address output by said transparent column address latch for decoding said column address and accessing select ones of said columns of memory elements as defined by said column address;

mode means for receiving external signals and selecting the one of said first or second mode in which said transparent column address latch functions;

said external signals as received by said mode means comprising said row and column address strobe signals occurring in a predetermined sequence; and said mode means comprising sequence detect means for detecting the sequence of reception of said row and column address strobe signals, said detect means generating a sequence signal which is at a first state when a first sequence is detected and in a second state when a second opposite sequence is detected; and enable means for controlling said transparent column address latch to operate in said first mode when said sequence signal is in said first state and in said second mode when said sequence signal is in said second state.

7. The semiconductor memory of claim 6 wherein said first mode is selected when said row address strobe signal precedes said column address strobe signal and said second mode is selected when said column address strobe signal precedes said row address strobe signal.

8. The semiconductor memory of claim 7 wherein the semiconductor memory is maintained in said second mode by locking said column address strobe signal in an active state such that it is always preceding said row address strobe signal.

* * * * *